United States Patent
Kobayashi et al.

(10) Patent No.: US 6,191,183 B1
(45) Date of Patent: Feb. 20, 2001

(54) METHOD FOR THE FORMATION OF SILICA THIN FILMS

(75) Inventors: Akihiko Kobayashi; Katsutoshi Mine; Takashi Nakamura; Motoshi Sasaki; Kiyotaka Sawa, all of Chiba (JP)

(73) Assignee: Dow Corning Toray Silicone Co., Ltd., Tokyo (JP)

( * ) Notice: Under 35 U.S.C. 154(b), the term of this patent shall be extended for 0 days.

(21) Appl. No.: 09/412,219

(22) Filed: Oct. 5, 1999

Related U.S. Application Data (62) Division of application No. 09/027,834, filed on Feb. 23, 1998, now abandoned.

(30) Foreign Application Priority Data

Feb. 24, 1997 (JP) .................................................... 9-056882
Apr. 28, 1997 (JP) .................................................... 9-111264

(51) Int. Cl.⁷ .................. C08J 3/28; C08J 7/04; B05D 5/12
(52) U.S. Cl. .................. 522/77; 522/79; 522/80; 522/83; 522/148; 528/31; 524/267; 524/731; 524/770; 524/773; 427/96; 427/498; 427/503; 428/447; 106/287.13; 106/287.14
(58) Field of Search .................. 524/861, 267, 524/731, 770, 773; 528/31; 522/148, 83, 80, 79, 77; 427/503, 96, 498, 572, 575; 106/287.13, 287.14

(56) References Cited

U.S. PATENT DOCUMENTS

| | | | |
|---|---|---|---|
| 3,615,272 | * | 10/1971 | Collins et al. . |
| 5,063,267 | * | 11/1991 | Hanneman et al. . |
| 5,091,162 | * | 2/1992 | Frye et al. . |
| 5,279,661 | * | 1/1994 | Gentle . |
| 5,609,925 | * | 3/1997 | Camilletti et al. . |
| 5,618,878 | * | 4/1997 | Skytich et al. . |
| 5,853,808 | * | 12/1998 | Arkles . |
| 6,015,457 | * | 1/2000 | Leung et al. . |

* cited by examiner

Primary Examiner—Susan W. Berman
(74) Attorney, Agent, or Firm—Rick D. Streu (57) ABSTRACT

The instant invention pertains to a composition that can form silica thin films, wherein said composition performs well as a substrate planarizing coating when applied to a substrate and can be converted by exposure to high-energy radiation into silica thin film with an excellent electrical insulating performance. The composition for the formation of silica thin films comprises (A) a hydrogen silsesquioxane resin that contains at least 45 weight % hydrogen silsesquioxane resin with a molecular weight no greater than 1,500; and (B) solvent. A silica thin film is produced by evaporating the solvent (B), and then converting at least a portion of the hydrogen silsesquioxane resin (A) to silica by exposing the surface of the said substrate to high-energy radiation. The preferred substrate is a semiconductor substrate having at least one electrically conductive layer.

11 Claims, 3 Drawing Sheets

METHOD FOR THE FORMATION OF SILICA THIN FILMS

This application is a Divisional of application Ser. No. 09/027,834, filed Feb. 23, 1998, now abandoned.

FIELD OF THE INVENTION

This invention relates to compositions that form silica thin films and to methods for the formation of silica thin films. More particularly, this invention relates to a silica thin film forming composition that has an excellent performance as a planarizing coating for substrates and that can be converted by exposure to high-energy radiation into a ceramic-like silica thin film that has excellent electrical insulating properties. This invention also relates to semiconductor devices that contain an electrically insulating layer and to a method for the fabrication of such semiconductor devices.

BACKGROUND OF THE INVENTION

Semiconductor devices such as electronic devices like DRAMs and logic integrated circuits (an interconnect structure comprising such elements as an electrically conductive layer and conductors) formed on the wafer (substrate) have been protected by providing an electrically insulating layer on the circuit surface. In the case of semiconductor devices that employ a multilevel interconnect structure formed by stacking, a plural number of electrical circuits, an interlayer dielectric layer has also been provided, for example, between the interconnections in an upper level and the interconnections in the underlying level.

The use of ceramic-like silica thin films as a protective or insulating layer for electronic devices is known. For example, U.S. Pat. No. 4,756,977 teaches a method for coating electronic devices with a silica thin film in which a solvent solution of hydrogen silsesquioxane resin is coated on a substrate, the solvent is then evaporated, and heating to 150° C. to 1,000° C. is carried out in order to effect conversion into ceramic-like silica.

However, hydrogen silsesquioxane resins typically contain a considerable amount of volatile component. As a consequence, exposure to the high temperatures specified above can cause such problems as a diminution in film thickness and the generation of internal stresses in the film. Moreover, outmigration and expulsion of the volatile component can cause contamination of surrounding equipment.

Methods for removing the low-molecular-weight component in hydrogen silsesquioxane resin have been proposed. For example, U.S. Pat. No. 5,416,190 teaches removal of the low-molecular-weight component through addition of solvent to already synthesized hydrogen silsesquioxane resin. Unfortunately, the removal of low-molecular-weight component by this method yields hydrogen silsesquioxane resin that has a poor performance as a planarizing coating when applied on substrates. In addition to the fact that high-molecular-weight hydrogen silsesquioxane resin itself performs poorly as a planarizing coating for substrates, high-molecular-weight hydrogen silsesquioxane resin has a high softening point (at least 180° C.) and its use for substrate planarization therefore requires heating and melting at high temperatures (at least 200° C.). High-molecular-weight hydrogen silsesquioxane resin also has a poor capacity to fill into the topographical irregularities on substrates for electronic devices having a multilayered structure and as a consequence may not be fully satisfactory in some applications.

It is therefore an object of this invention is to provide a silica thin film forming composition that upon application to substrate performs well as a planarizing coating for the substrate and that can be converted by exposure to high-energy radiation into silica thin film with an excellent electrical insulating performance.

It is also an object of this invention is a method for the formation of silica thin films.

It is also an object of this invention to provide semiconductor devices that contain an electrically insulating layer that exhibits an excellent capacity to coat and planarize the interconnect structures on the substrate.

It is also an object of this invention to provide a method for the fabrication of such semiconductor devices.

SUMMARY OF THE INVENTION

The present invention relates to a composition for the formation of silica thin films, said composition comprising (A) hydrogen silsesquioxane resin that contains at least 45 weight % hydrogen silsesquioxane resin with a molecular weight no greater than 1,500 and (B) solvent. The present invention also relates to a method for the formation of silica thin films, wherein the method comprises coating the surface of a substrate with the silica thin film forming composition; evaporating the solvent (B); and converting at least a portion of the hydrogen silsesquioxane resin (A) to silica by exposing the surface of the said substrate to high-energy radiation. The preferred substrate is a semiconductor device in which the surface of the device has an interconnect structure comprising at least one electrically conductive layer.

DETAILED DESCRIPTION OF THE INVENTION

The hydrogen silsesquioxane resin used in the present invention is polysiloxane whose main skeleton is comprised of the trifunctional siloxane unit $HSiO_{3/2}$, (i.e., a polymer with the general formula $(HSiO_{3/2})_n$ where n is an integer). The hydrogen silsesquioxane resin which can be used in the invention includes ladder polysioxanes and cage polysiloxanes which are differentiated by their molecular structure.

The terminals of the ladder polysiloxanes can be endblocked by, for example, the hydroxyl group, a triorganosiloxy group such as trimethylsiloxy, or a diorganohydrogensiloxy group such as dimethylhydrogensiloxy.

Figure 1:
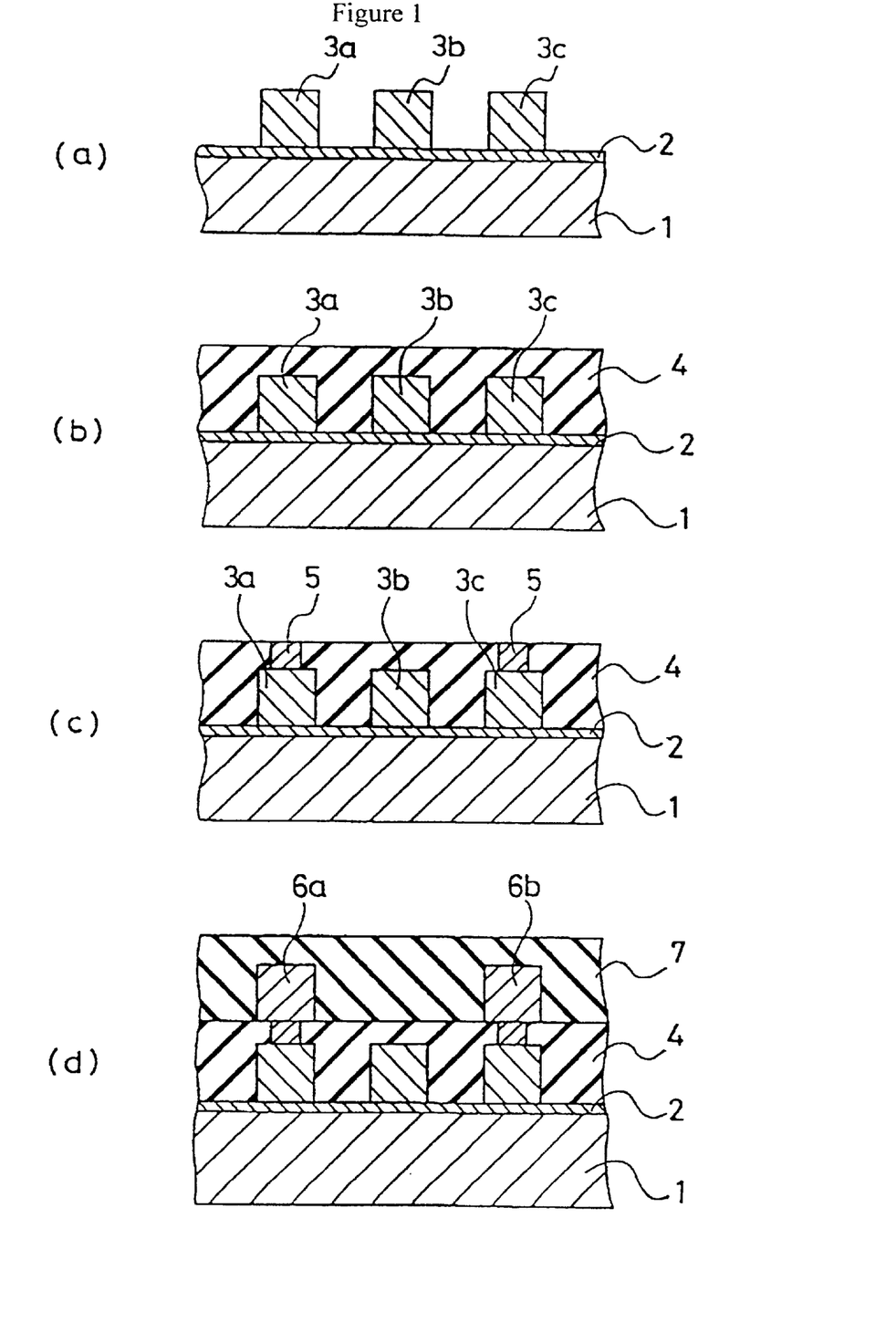
FIG. 1 contains a schematic diagram that shows the various processes in the fabrication of a semiconductor device of this invention.

The hydrogen silsesquioxane resin (A) must contain at least 45 weight %, and preferably contains at least 50 weight %, hydrogen silsesquioxane resin with a molecular weight no greater than 1,500. When the content of hydrogen silsesquioxane resin with a molecular weight no greater than 1,500 is below 45 weight % the coating performs poorly as a substrate planarizing coating. In particular, the resin (<45 wt % molecular weight≦1,500) evidences a poor capacity to fill into the topographical irregularities on substrates for electronic devices having a multilayered structure, i.e. the lower level interconnect 3a, 3b, 3c and the upper level interconnects 6a and 6b of FIG. 1(d) and cannot form a uniform silica thin film having excellent electrical insulating properties.

Hydrogen silsesquioxane resin is generally known in the art and can be synthesized by the hydrolysis of trichlorosilane and ensuing polycondensation (see U.S. Pat. No. 3,615,272; and Japanese Patent Application Laid Open (Kokai or Unexamined) Numbers Sho 59-189126 (189,126/1984) and Sho 60-42426 (42,426/1985)).

The hydrogen silsesquioxane resin (A) can be prepared by providing a known method for synthesizing hydrogen silsesquioxane resin with a means for increasing the production of low-molecular-weight component (molecular weight no greater than 1,500). The hydrogen silsesquioxane resin (A) can also be prepared by separating the low-molecular-weight component by running a molecular weight fractionation on hydrogen silsesquioxane resin already synthesized a known method. This molecular weight fractionation can be carried out by dissolving the already synthesized hydrogen silsesquioxane resin in nonpolar solvent and adding polar solvent to the resulting solution.

No particular restrictions apply to the solvent (B) other than that it should be capable of dissolving component (A) and should not induce chemical changes in component (A). Applicable solvents may be exemplified by aromatic solvents such as toluene, xylene, and the like; aliphatic solvents such as hexane, heptane, octane, and the like; ketone solvents such as methyl ethyl ketone, methyl isobutyl ketone, and the like; aliphatic ester solvents such as butyl acetate, isoamyl acetate, and the like; and silicone solvents such as chain methylsiloxanes (e.g., 1,1,1,3,3,3-hexamethyldisiloxane and 1,1,3,3-tetramethyldisiloxane), cyclic siloxanes (e.g., 1,1,3,3,5,5,7,7-octamethyltetracyclosiloxane and 1,3,5,7-tetramethyltetracyclosiloxane), and silane compounds (e.g., tetramethylsilane and dimethyldiethylsilane). The silicone solvents are preferred.

The silica thin film forming composition contains 5 to 50 weight percent hydrogen silsesquioxane resin (A), preferably 10 to 40 weight percent hydrogen silsesquioxane resin (A) based on the combined weight of (A) and (B).

The silica thin film forming composition can be prepared simply by mixing components (A) and (B) to homogeneity. In addition to components (A) and (B), known ceramic oxide precursors may also be admixed insofar as the objects of the present invention are not impaired. These ceramic oxide precursors are exemplified by tetra-n-propoxyzirconium, tetraisobutoxytitanium, trispentanedioxoaluminum, pentaethoxytantalum, tripropoxyvanadium, pentaethoxyniobium, pentanedioxozirconium, and dibutoxybispentanedioxotitanium.

A platinum catalyst or rhodium catalyst can be added to the silica thin film forming composition in order to increase the rate and extent of formation of the silica thin film. These catalysts are exemplified by chloroplatinic acid and the complexes of chloroplatinic acid and tetramethyldivinyldisiloxane. These catalysts will generally be used in the range from 1 to 500 weight parts for each one million weight parts component (A).

The composition of the present invention forms a silica thin film when exposed to high-energy radiation. As used in the present invention, the expression "silica" refers to silicon dioxide ($SiO_2$) and encompasses both amorphous silica and amorphous silica that is not completely free of silanol groups and/or hydrogen atoms. When a ceramic precursor as described above has been added, this compound will also be present.

Substrates usable in the method are exemplified by ceramic substrates, various metal substrates, and electronic devices; preferably electronic devices.

The method for the formation of silica thin films comprises coating the surface of a substrate with the silica thin film forming composition comprising the hydrogen silsesquioxane resin (A) and solvent (B); evaporating the solvent (B); and thereafter converting at least a portion of the said hydrogen silsesquioxane resin (A) to silica by exposing the surface of the said substrate to high-energy radiation.

The technique for coating the silica thin film forming composition on the substrate is not critical as long as the particular technique can generate a uniform application of the silica-forming composition. Suitable coating techniques are exemplified by spin coating, dip coating, spray coating, and flow coating.

The technique for evaporating component (B) is also not critical and can be exemplified by standing at ambient or elevated temperature and drying in air, under reduced pressure, or under a gas current. Drying time is ordinarily not necessary when spin coating is used as the coating technique since the solvent is expelled during the rotation.

After the substrate surface has been coated, at least a portion of the hydrogen silsesquioxane resin (A) thereon is converted to silica by exposing the substrate surface to high-energy radiation. The high-energy radiation can be electron beam, ultraviolet radiation, x-rays, infrared radiation, microwave radiation, and so forth; preferably electron beam. Exposure to the high-energy radiation is preferably effected in air or an oxygen-containing gas. Gases other than oxygen-containing gases may also be used. The non-oxygen gas may be exemplified by nitrogen and argon.

The high-energy radiation effects conversion into silica by activating the silicon-bonded hydrogen in the hydrogen silsesquioxane resin, resulting in oxidation by the gaseous oxygen in the ambient atmosphere. The temperature during exposure to the high-energy radiation and the conversion into silica is preferably a temperature that provides the maximum inhibition of expulsion and outmigration of low-molecular-weight hydrogen silsesquioxane resin and is preferably in the range from 10° C. to 50° C.

As shown in FIG. 1(a), the fabrication of semiconductor devices commences with the formation of a base insulating layer 2 on the surface of a semiconductor substrate 1. An electrically conductive layer is then formed by sputtering a metal, for example, aluminum, on the base insulating layer 2. Lower level interconnects 3a, 3b and 3c are thereafter formed by patterning the conductive layer by known methods.

As shown in FIG. 1(b), an inuslating layer 4 is subsequently formed over these lower level interconnects 3a, 3b and 3c. The surface of this insulating layer is then masked with a photoresist and, for example, through holes that reach, respectively, to the lower level interconnects 3a and 3c are subsequently provided by selectively etching the insulating layer 4 that overlies the lower level interconnects 3a and 3c. A conductive layer is formed by sputtering a metal, for example, aluminum, within these through holes. This is followed by plasma etching to effect etchback until exposure of the insulating layer 4, which leave interlevel connects 5 within the through holes (see FIG. 1(c)).

Upper level interconnects 6a and 6b and insulating layer 7 are then formed on the etched-back surface by the same methods as used to provide the lower level interconnects 3a and 3c and insulating layer 4 (see FIG. 1(d)). The preceding steps result in the formation on the semiconductor substrate 1 of a multilevel interconnect structure of lower level interconnects 3a and 3c and upper level interconnects 6a and 6b in which the interconnects are electrically insulated by the base insulating layer 2 and the interlayer dielectric layers 4 and 7.

The base insulating layer 2 and the interlayer dielectric layers 4 and 7 may be a thin film that is mainly silica and that is produced the silica thin film forming composition. In order to form the base insulating layer 2 and interlayer dielectric layers 4 and 7, a coating is first formed by the application of the silica thin film forming composition on the surface of the semiconductor substrate 1 (FIG. 1(a)), or over the lower level interconnects 3a, 3b and 3c (FIG. 1(b)), or over the upper level interconnects 6a and 6b (FIG. 1(d)). The solvent is then evaporatively removed from the applied coating.

During the formation of the coating gaps may be produced at the bottoms formed by the topographical variations in the semiconductor substrate, i.e., the depressions formed among the lower level interconnects 3a, 3b and 3c and between upper level interconnects 6a and 6b. The surface of the coating itself also frequently assumes a wave-like or undulating condition. In order to eliminate these gaps and the undulating surface condition, the applied coating is preferably heated and melted at a temperature that avoids volatilization of the coating at no greater than 60° C., in order to fill in and embed the topographical variations and planarize the applied coating.

Curing of the hydrogen silsesquioxane resin coating is carried out by exposing the applied coating to high-energy radiation. This results in the conversion of at least a portion of the hydrogen silsesquioxane resin making up the coating into silica, thereby forming a silica base insulating layer 2, or a silica interlayer dielectric layer 4 or 7.

The silica thin film forming composition provides an excellent performance as a planarizing coating for substrates, has an excellent capacity to fill the uneven topographical features on substrates for electronic devices with multilayered structures, and is converted by exposure to high-energy radiation to silica thin film with excellent electrical insulating properties. This composition is useful in applications such as an interlayer dielectric film in multi-layered semiconductor devices.

So that those skilled in the art can understand and appreciate the invention taught herein, the following examples are presented, it being understood that these examples should not be used to limit the scope of this invention found in the claims.

EXAMPLES

"Parts" in the examples refers to weight parts. The conversion to silica in the examples was evaluated by measurement of the % residual SiH in the film by Fourier-transform infrared absorption spectroscopic analysis. The measurements in Examples 2 to 6 and Comparative Example 1 were carried out in transmission mode, while the measurements in Example 7 and Comparative Example 2 were carried out in reflection mode. For reference, the refractive index was measured in each example on the hydrogen silsesquioxane resin thin film afforded by spin coating and on the silica thin film after electron beam exposure.

The molecular weight was measured by gel permeation chromatography (GPC) using the following measurement conditions.

instrument: 802A from Tosoh Corporation
column: G3000/G4000/G5000/G6000
carrier solvent: toluene
column temperature: 30° C.
molecular weight standard: polystyrene
detection: differential refractometer
sample: 2 wt % solids (toluene solution)

Example 1

Resin Preparation

Hydrogen silsesquioxane resin was synthesized by the method described in Example 1 of U.S. Pat. No. 3,615,272. GPC analysis of the hydrogen silsesquioxane resin product gave the following results: number-average molecular weight of 1,540, weight-average molecular weight of 7,705, 41 wt %o component with a molecular weight up to 1,500. The softening point was 90° C.

This hydrogen silsesquioxane resin was subjected to molecular weight fractionation by the method described in Example 1 of U.S. Pat. No. 5,416,190. GPC analysis of the resulting hydrogen silsesquioxane resin fraction gave the following results: number-average molecular weight of 743, weight-average molecular weight of 1,613, and 72 wt % component with a molecular weight up to 1,500. Its softening point was 25° C.

Example 2

The hydrogen silsesquioxane resin fraction prepared in Example 1 was dissolved in a mixed solvent comprising 30 parts hexamethyldisiloxane and 70 parts octamethyltrisiloxane to give a hydrogen silsesquioxane resin solution containing 30 wt % solids.

A hydrogen silsesquioxane resin film with a thickness of 6,520 angstroms was formed on a silicon wafer by spin coating the solution onto the wafer using a preliminary rotation of 500 rpm for 3 seconds and a main rotation of 3,000 rpm for 10 seconds. A thorough solvent evaporation was then carried out.

The resulting silicon wafer was exposed to an electron beam (dose of 160 Mrad) from an electron beam irradiator (acceleration voltage of 165 kV) under nitrogen gas that contained 70 ppm oxygen. The hydrogen silsesquioxane resin was converted to silica without a significant decline in film thickness. The post-conversion film was free of cracking and other abnormalities. Results are reported in Table 1.

Example 3

A hydrogen silsesquioxane resin film with a thickness of 6,504 angstroms was formed on a silicon wafer by spin coating hydrogen silsesquioxane resin solution prepared as described in Example 2 onto the wafer using a preliminary rotation of 500 rpm for 3 seconds and a main rotation of 3,000 rpm for 10 seconds. A thorough solvent evaporation was then carried out.

The resulting silicon wafer was exposed to an electron beam (dose of 240 Mrad) from an electron beam irradiator (acceleration voltage of 165 kV) under nitrogen gas that contained 70 ppm oxygen. The hydrogen silsesquioxane resin was converted to silica without a significant decline in film thickness. The post-conversion film was free of cracking and other abnormalities. The results are reported in Table 1.

Example 4

A hydrogen silsesquioxane resin solution containing 40 wt % solids was prepared by dissolving the hydrogen silsesquioxane resin fraction prepared in Example 1 in a mixed solvent comprised of 30 parts hexamethyldisiloxane and 70 parts octamethyltrisiloxane.

A hydrogen silsesquioxane resin film with a thickness of 13,215 angstroms was formed on a silicon wafer by spin coating the solution onto the wafer using a preliminary rotation of 500 rpm for 3 seconds and a main rotation of 3,000 rpm for 10 seconds. A thorough solvent evaporation was then carried out.

The resulting silicon wafer was exposed to an electron beam (dose of 160 Mrad) from an electron beam irradiator (acceleration voltage of 165 kV) under nitrogen gas that contained 70 ppm oxygen. No significant decline in film thickness occurred and the hydrogen silsesquioxane resin was converted to silica as the measurement results show. The post-conversion film was free of cracking and other abnormalities.

The silicon wafer was submitted to Fourier-transform infrared absorption spectroscopic analysis (transmission mode) both after spin coating and after exposure to the electron beam. The relative SiH mole % per unit film thickness was calculated by dividing the film thickness into the absorbance of the absorption peak at 2,260 $cm^{-1}$ assigned to the SiH stretching vibration. Assuming 100% for the value after spin coating, the results showed a drop down to 80% after electron beam exposure, which confirmed the loss of SiH groups and thus the occurrence of curing. In addition, the absorption peak assigned to the SiO stretching vibration appeared after spin coating as a single peak at 1,125 $cm^{-1}$ originating with the cage $T^H$ structure, but after electron beam exposure the peak at 1,125 $cm^{-1}$ was reduced in strength while a peak at 1,070 $cm^{-1}$ also appeared. This latter peak originated with the random network $T^H$ structure or $SiO_2$ structure. These observations confirmed that a portion of the film had been converted to silica by exposure to the electron beam. The results are reported in Table 1.

Example 5

A hydrogen silsesquioxane resin film with a thickness of 6,520 angstroms was formed on a silicon wafer by spin coating hydrogen silsesquioxane resin solution prepared as described in Example 2 onto the wafer using a preliminary rotation of 500 rpm for 3 seconds and a main rotation of 3,000 rpm for 10 seconds. A thorough solvent evaporation was then carried out.

The resulting silicon wafer was exposed to an electron beam (dose of 160 Mrad) from an electron beam irradiator (acceleration voltage of 165 kV) under nitrogen gas that contained 70 ppm oxygen and was then annealed in a quartz oven at 400° C. for 1 hour under a nitrogen current containing about 100 ppm oxygen.

The extent of conversion into silica was somewhat greater than in Example 1, but there was still no significant decline in film thickness. The final silica thin film was also free of cracking and other abnormalities. The results are reported in Table 1.

Example 6

A hydrogen silsesquioxane resin solution containing 30 wt % solids was prepared by dissolving the hydrogen silsesquioxane resin fraction prepared in Example 1 in methyl isobutyl ketone.

A hydrogen silsesquioxane resin film with a thickness of 6,631 angstroms was formed on a silicon wafer by spin coating the above-described solution onto the wafer using a preliminary rotation of 500 rpm for 3 seconds and a main rotation of 3,000 rpm for 10 seconds. A thorough solvent evaporation was then carried out.

The resulting silicon wafer was exposed to an electron beam (dose of 160 Mrad) from an electron beam irradiator (acceleration voltage of 165 kV) under nitrogen gas that contained 70 ppm oxygen. Conversion into silica occurred without a significant decline in film thickness. The post-conversion silica thin film was free of cracking and other abnormalities.

Example 7

A hydrogen silsesquioxane resin solution containing 25 wt % solids was prepared by dissolving the hydrogen silsesquioxane resin fraction prepared in Example 1 in a mixed solvent of 30 parts hexamethyldisiloxane and 70 parts octamethyltrisiloxane.

Figure 2:
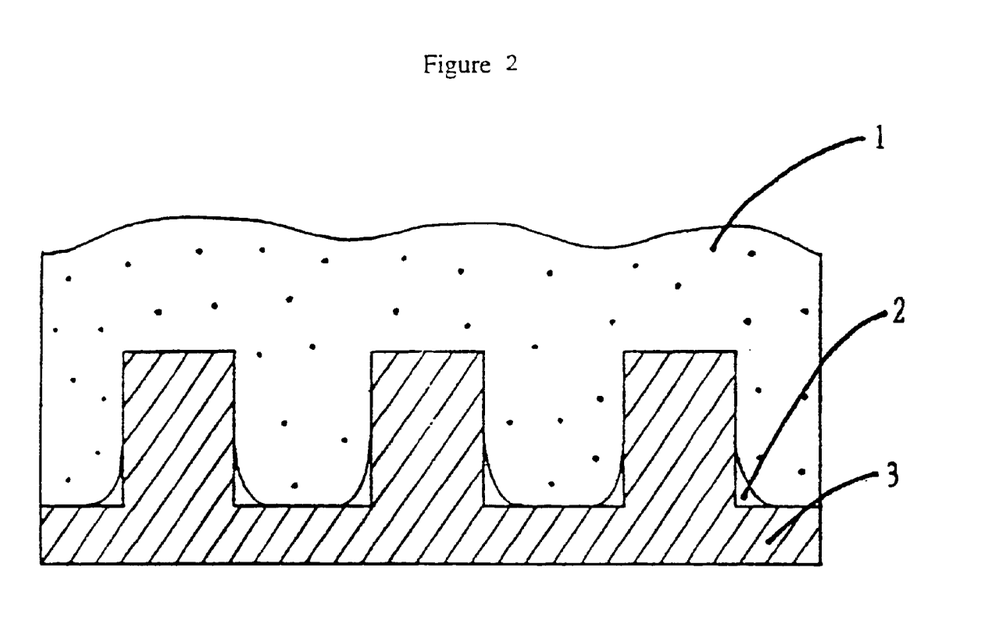
FIG. 2 contains a cross section showing the hydrogen silsesquioxane resin thin film produced in Example 7 by spin coating.

As seen in FIG. 2 a film 1 with a maximum depth of 8,120 angstroms was formed on a patterned polysilicon wafer 3

(feature height of 0.5 μm, feature width of 0.18 μm, and feature spacing of 0.18 μm) by spin coating the above-described solution on the wafer using a preliminary rotation of 500 rpm for 3 seconds and a main rotation of 3,000 rpm for 10 seconds. A thorough solvent evaporation was then carried out. Void regions 2 were present. Fluidization occurred when this silicon wafer was heated on a hot plate for 3 minutes at 60° C. under a nitrogen current. This fluidization resulted in a thorough filling of the interfeature gaps and planarization of the resin surface.

Figure 3:
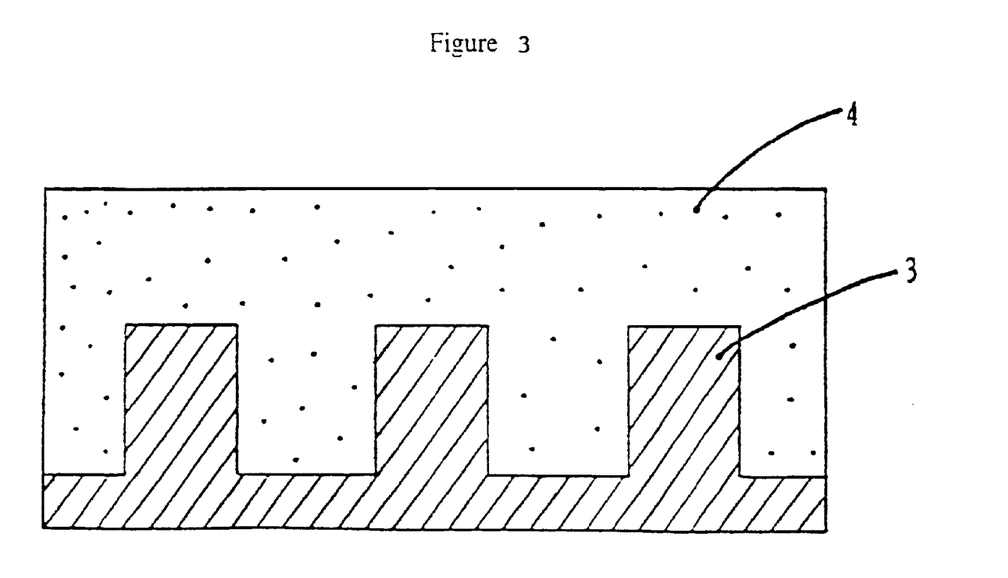
FIG. 3 contains a cross section showing the silica thin film produced in Example 7.

The silicon wafer 3 was exposed to an electron beam (dose of 160 Mrad) from an electron beam irradiator (acceleration voltage of 165 kV) under nitrogen gas that contained 70 ppm oxygen. No cracking or other abnormalities were observed in the resulting silica thin film 4 as seen in FIG. 3.

Comparative Example 1

A solution with a solids content of 35 wt % was prepared by dissolving the unfractionated hydrogen silsesquioxane resin whose synthesis is described in Example 1 (41 wt % content of component with molecular weight up to 1,500) in methyl isobutyl ketone.

A hydrogen silsesquioxane resin film with a thickness of 12,780 angstroms was formed on a silicon wafer by spin coating the above-described solution onto the wafer using a preliminary rotation of 500 rpm for 3 seconds and a main rotation of 3,000 rpm for 10 seconds. A thorough solvent evaporation was then carried out. The silicon wafer was then annealed in a quartz oven at 400° C. for 1 hour under a nitrogen current containing about 100 ppm oxygen.

The hydrogen silsesquioxane resin was converted into silica although a substantial decline in film thickness was observed in this case. Cracking was also observed in the post-conversion silica thin film. The results are reported in Table 1.

Comparative Example 2

A solution with a solids content of 20 wt % was prepared by dissolving the unfractionated hydrogen silsesquioxane resin whose synthesis is described in Example 1 (41 wt % content of component with molecular weight up to 1,500) in methyl isobutyl ketone.

Figure 4:
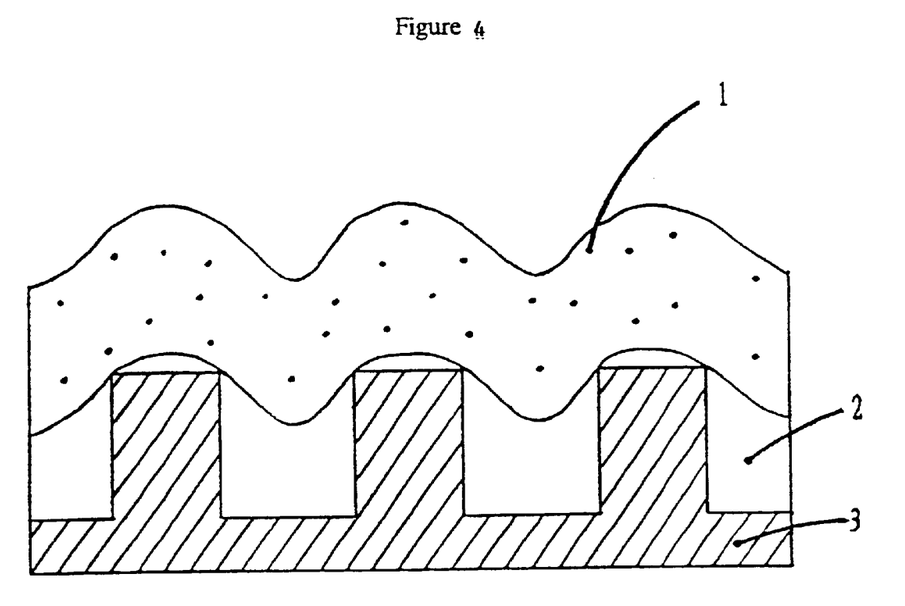
FIG. 4 contains a cross section showing the hydrogen silsesquioxane resin thin film produced in Comparative Example 2 by spin coating.

As seen in FIG. 4 a hydrogen silsesquioxane film 1 with a maximum depth of 8,036 angstroms was formed on a patterned polysilicon wafer 3 (feature height of 0.5 μm, feature width of 0.18 μm, and feature spacing of 0.18 μm) by spin coating the solution on the wafer using a preliminary rotation of 500 rpm for 3 seconds and a main rotation of 3,000 rpm for 10 seconds. A thorough solvent evaporation was then carried out. Void regions 2 were present. Fluidization occurred when this silicon wafer was heated on a hot plate for 3 minutes at 60° C. under a nitrogen current. In this case, however, the fluidization did not achieve a thorough filling of the interfeature gaps or planarization of the resin surface.

Figure 5:
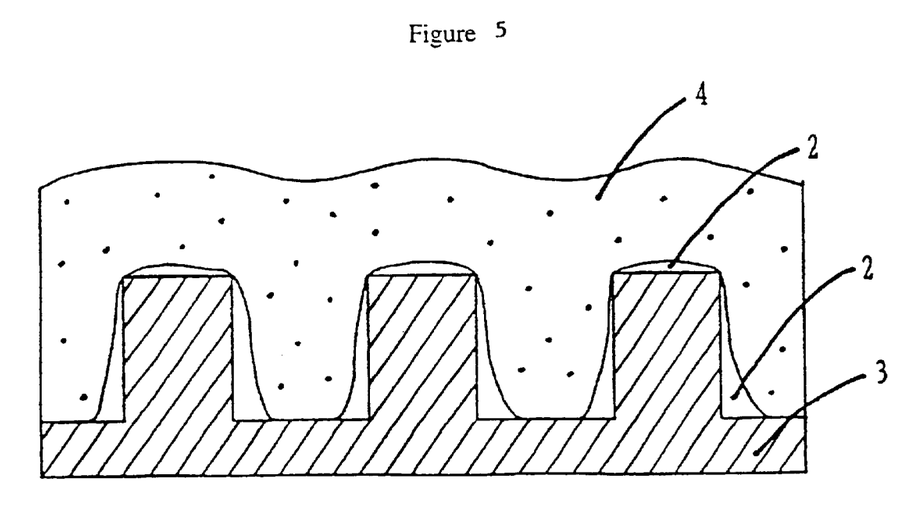
FIG. 5 contains a cross section showing the silica thin film produced in Comparative Example 2.

The silicon wafer 3 was then exposed to an electron beam (dose of 160 Mrad) from an electron beam irradiator (acceleration voltage of 165 kV) under nitrogen gas that contained 70 ppm oxygen. The hydrogen silsesquioxane resin was converted into silica. As seen in FIG. 5. the post-conversion silica thin film 4 was free of cracks, however the undulations in the resin surface had not been eliminated and void regions 2 remained. The results are reported in Table 1.

Example 8

A hydrogen silsesquioxane resin solution containing 15 wt % solids was prepared by dissolving the hydrogen silsesquioxane resin fraction prepared in Example 1 in a mixed solvent of 30 parts hexamethyldisiloxane and 70 parts octamethyltrisiloxane.

This solution was used to produce the electrically insulating layer between interconnect levels in a semiconductor device having a multilevel aluminum interconnect structure (pattern with a feature height of 0.5 μm and a feature width and feature spacing of 0.18 μm each) fabricated on a silicon substrate. The base features were coated with a CVD (chemical vapor deposition) film and the solution was then spin coated on the substrate using a preliminary rotation of 500 rpm for 3 seconds and a main rotation of 3,000 rpm for 10 seconds. A thorough solvent evaporation was then carried out to form a coating with a thickness (deepest section) of 6,540 Å.

The substrate was subsequently exposed to a dose of 160 Mrad from an electron beam irradiator (acceleration voltage of 165 kV) under nitrogen that contained 70 ppm oxygen. Conversion of the hydrogen silsesquioxane resin in the coating to silica was confirmed. No cracking or other abnormalities were observed in the post-conversion film (electrically insulating layer).

A CVD film was formed on this electrically insulating layer and a multilevel interconnect structure was subsequently fabricated by the via hole contact technique. No abnormalities were observed in the electrical properties of the resulting device.

Example 9

The solution described in Example 8 was used in this example to produce the electrically insulating layer between interconnect levels in a semiconductor device having a multilevel aluminum interconnect structure (pattern with a feature height of 0.5 μm and a feature width and feature spacing of 0.18 μm each) fabricated on a silicon substrate. The base features were coated with a CVD film and the solution was then spin coated on the substrate using a preliminary rotation of 500 rpm for 3 seconds and a main rotation of 3,000 rpm for 10 seconds. A thorough solvent evaporation was then carried out to form a coating with a thickness (deepest section) of 6,530 Å.

The substrate was subsequently exposed to a dose of 240 Mrad from an electron beam irradiator (acceleration voltage of 165 kV) under nitrogen that contained 70 ppm oxygen. Conversion of the hydrogen silsesquioxane resin in the coating to silica was confirmed. No cracking or other abnormalities were observed in the post-conversion film (electrically insulating layer).

A CVD film was formed on this electrically insulating layer and a multilevel interconnect structure was subsequently fabricated by the via hole contact technique. No abnormalities were observed in the electrical properties of the resulting device.

Example 10

A hydrogen silsesquioxane resin solution containing 25 wt % solids was prepared by dissolving the hydrogen silsesquioxane resin fraction prepared in Example 1 in a mixed solvent of 30 parts hexamethyldisiloxane and 70 parts octamethyltrisiloxane.

This solution was used to produce the electrically insulating layer between interconnect levels in a semiconductor device having a multilevel aluminum interconnect structure (pattern with a feature height of 1.0 μm and a feature width and feature spacing of 0.18 μm each) fabricated on a silicon substrate. The base features were coated with a CVD film and the solution was then spin coated on the substrate using a preliminary rotation of 500 rpm for 3 seconds and a main rotation of 3,000 rpm for 10 seconds. A thorough solvent evaporation was then carried out to form a coating with a thickness (deepest section) of 13,240 Å.

The substrate was subsequently exposed to a dose of 160 Mrad from an electron beam irradiator (acceleration voltage of 165 kV) under nitrogen that contained 70 ppm oxygen. Conversion of the hydrogen silsesquioxane resin in the coating to silica was confirmed. No cracking or other abnormalities were observed in the post-conversion film (electrically insulating layer).

A CVD film was formed on this electrically insulating layer and a multilevel interconnect structure was subsequently fabricated by the via hole contact technique. No abnormalities were observed in the electrical properties of the resulting device.

Example 11

The solution described in Example 8 was used in this example to produce the electrically insulating layer between interconnect levels in a semiconductor device having a multilevel aluminum interconnect structure (pattern with a feature height of 0.5 μm and a feature width and feature spacing of 0.18 μm each) fabricated on a silicon substrate. The base features were coated with a CVD film and the solution was then spin coated on the substrate using a preliminary rotation of 500 rpm for 3 seconds and a main rotation of 3,000 rpm for 10 seconds. The solvent was thoroughly evaporated off to form a coating with a thickness (deepest section) of 6,540 Å.

The substrate was subsequently exposed to a dose of 160 Mrad from an electron beam irradiator (acceleration voltage of 165 kV) under nitrogen that contained 70 ppm oxygen. Conversion of the hydrogen silsesquioxane resin in the coating to silica was confirmed. No cracking or other abnormalities were observed in the post-conversion film (electrically insulating layer).

The substrate was subsequently baked for 1 hour in a quartz furnace at 400° C. under a current of nitrogen with an oxygen concentration of approximately 100 ppm.

The extent of conversion to silica was slightly advanced over that in Example 8, but again no cracking or other abnormalities were observed in the film (electricalfy insulating layer).

A CVD film was formed on this electrically insulating layer and a multilevel interconnect structure was subsequently fabricated by the via hole contact technique. No abnormalities were observed in the electrical properties of the resulting device.

Example 12

The fraction described in Example 1 was dissolved in methyl isobutyl ketone to give a solution that contained 15 wt % solids.

This solution was used to produce the electrically insulating layer between interconnect levels in a semiconductor device having a multilevel aluminum interconnect structure (pattern with a feature height of 0.5 μm and a feature width and feature spacing of 0.18 μm each) fabricated on a silicon substrate. The base features were coated with a CVD film and the solution was then spin coated on the substrate using a preliminary rotation of 500 rpm for 3 seconds and a main rotation of 3,000 rpm for 10 seconds. A thorough solvent evaporation was then carried out to form a coating with a thickness (deepest section) of 6,485 Å.

The substrate was subsequently exposed to a dose of 160 Mrad from an electron beam irradiator (acceleration voltage of 165 kV) under nitrogen that contained 70 ppm oxygen. Conversion of the hydrogen silsesquioxane resin in the coating to silica was confirmed. No cracking or other abnormalities were observed in the post-conversion film (electrically insulating layer).

A CVD film was formed on this electrically insulating layer and a multilevel interconnect structure was subsequently fabricated by the via hole contact technique. No abnormalities were observed in the electrical properties of the resulting device.

Example 13

A hydrogen silsesquioxane resin solution containing 25 wt % solids was prepared by dissolving the hydrogen silsesquioxane resin fraction prepared in Example 1 in a mixed solvent of 30 parts hexamethyldisiloxane and 70 parts octamethyltrisiloxane.

This solution was used to produce the electrically insulating layer between interconnect levels in a semiconductor device having a multilevel aluminum interconnect structure (pattern with a feature height of 0.5 μm and a feature width and feature spacing of 0.18 μm each) fabricated on a silicon substrate. The base features were coated with a CVD film and the solution was then spin coated on the substrate using a preliminary rotation of 500 rpm for 3 seconds and a main rotation of 3,000 rpm for 10 seconds. A thorough solvent evaporation was then carried out to form a uniform coating with a thickness at the deepest section of 8,230 Å.

Fluidization occurred when this substrate was heated on a hot plate for 3 minutes at 60° C. under a nitrogen current. This fluidization resulted in a thorough infilling between the features and planarization of the coating surface.

The substrate was exposed to a dose of 160 Mrad from an electron beam irradiator (acceleration voltage of 165 kV) under nitrogen that contained 70 ppm oxygen. Conversion of the hydrogen silsesquioxane resin in the coating to silica was confirmed. No cracking or other abnormalities were observed in the post-conversion film (electrically insulating layer).

A CVD film was formed on this electrically insulating layer and a multilevel interconnect structure was subsequently fabricated by the via hole contact technique. No abnormalities were observed in the electrical properties of the resulting device.

Example 14

A hydrogen silsesquioxane resin solution containing 18 wt % solids was prepared by dissolving the hydrogen silsesquioxane resin fraction prepared in Example 1 in a mixed solvent of 30 parts hexamethyldisiloxane and 70 parts octamethyltrisiloxane.

This solution was used to produce the pre-metal layer in a semiconductor device having a multilevel aluminum interconnect structure (pattern with a feature height of 0.5 $\mu$m and a feature width and feature spacing of 0.18 $\mu$m each) fabricated on a silicon substrate. The solution was spin coated on the substrate using a preliminary rotation of 500 rpm for 3 seconds and a main rotation of 3,000 rpm for 10 seconds. A thorough solvent evaporation was then carried out to form a coating with a thickness (deepest section) of 7,005 Å.

This substrate was exposed to a dose of 160 Mrad from an electron beam irradiator (acceleration voltage of 165 kV) under nitrogen that contained 70 ppm oxygen. Conversion of the hydrogen silsesquioxane resin in the coating to silica was confirmed. No cracking or other abnormalities were observed in the post-conversion film (electrically insulating layer). The substrate was then additionally baked for 1 hour at 700° C. in a quartz furnace. Although the extent of conversion to silica at this point had reached 100%, no cracking or other abnormalities were observed.

A multilevel interconnect structure was subsequently fabricated on this electrically insulating layer using the contact/via hole contact technique. No abnormalities were observed in the electrical properties of the resulting device.

Comparative Example 3

A hydrogen silsesquioxane resin with a number-average molecular weight of 1,540 and a weight-average molecular weight of 7,705 (component with a molecular weight no greater than 1,500=41%, softening point=90° C.) was dissolved in methyl isobutyl ketone to prepare a solution containing 18 wt % solids.

This solution was used to produce the electrically insulating layer between interconnect levels in a semiconductor device having a multilevel aluminum interconnect structure (pattern with a feature height of 1.0 $\mu$m and a feature width and feature spacing of 0.18 $\mu$m each) fabricated on a silicon substrate. The base features were coated with a CVD film and the solution was then spin coated on the substrate using a preliminary rotation of 500 rpm for 3 seconds and a main rotation of 3,000 rpm for 10 seconds. A thorough solvent evaporation was then carried out to form a coating with a thickness (deepest section) of 12,780 Å.

The wafer was then baked for 1 hour at 400° C. in a quartz furnace under a current of nitrogen with an oxygen concentration of approximately 100 ppm.

A substantial reduction in coating thickness occurred and conversion of the hydrogen silsesquioxane resin into silica was confirmed. Cracking was observed in the post-conversion film (electrically insulating layer).

A CVD film was formed on this electrically insulating layer and a multilevel interconnect structure was subsequently fabricated by the via hole contact technique. In this case defective electrical contact was observed in portions of the device.

Comparative Example 4

The resin described in Comparative Example 3 was dissolved in methyl isobutyl ketone to give a solution containing 22 wt % solids.

This solution was used to produce the electrically insulating layer between interconnect levels in a semiconductor device having a multilevel aluminum interconnect structure (pattern with a feature height of 0.5 $\mu$m and a feature width and feature spacing of 0.18 $\mu$m each) fabricated on a silicon substrate. The base features were coated with a CVD film and the solution was then spin coated on the substrate using a preliminary rotation of 500 rpm for 3 seconds and a main rotation of 3,000 rpm for 10 seconds. A thorough solvent evaporation was then carried out to form a coating with a thickness (deepest section) of 8,480 Å.

Heating the resulting substrate on a hot plate for 3 minutes at 60° C. under a nitrogen current did result in fluidization, but in this case a thorough infilling between the features and planarization of the coating surface were not obtained.

The substrate was then exposed to a dose of 160 Mrad from an electron beam irradiator (acceleration voltage of 165 kV) under nitrogen that contained 70 ppm oxygen, conversion of the hydrogen silsesquioxane resin in the coating to silica was confirmed. While no cracking or other abnormalities were observed in the post-conversion film (electrically insulating layer), the undulations (waves) in the surface had not been eliminated.

A CVD film was formed on this electrically insulating layer and the fabrication of a multilevel interconnect structure was subsequently attempted by the via hole contact technique. However, in this case microfabrication proved to be impossible due to the frequent elevations and depressions in the surface.

TABLE 1

| | film thickness in angstroms | | | refractive index (RI) | | | extent of film curing (*1) | cracking |
|---|---|---|---|---|---|---|---|---|
| | after spin coating | after electron beam exposure | after annealing | after spin coating | after electron beam exposure | after annealing | | |
| 2 | 6520 | 6413 | — | 1.401 | 1.363 | — | 70 | no |
| 3 | 6504 | 6412 | — | 1.402 | 1.369 | — | 57 | no |
| 4 | 13215 | 12951 | — | 1.403 | 1.37 | — | 80 | no |
| 5 | 6520 | 6413 | 6355 | 1.401 | 1.371 | 1.372 | 60 | no |
| 6 | 6631 | 6532 | — | 1.401 | 1.369 | — | 71 | no |
| 7 | — | — | — | — | — | — | — | no |
| Comp. Ex. 1 | 12780 | — | 8798 | 1.409 | — | 1.373 | 68 | yes |
| Comp. Ex. 2 | — | — | — | 1.408 | 1.378 | — | — | no |

*1: % SiH by transmission IR after the final treatment

What is claimed is:

1. A method for the formation of silica thin films, wherein the method comprises
    i) coating the surface of s substrate with a silica thin film forming composition comprising (A) hydgrogen silsesquioxane resin that contains at least 45 weight % hydrogen silsesquioxane resin with a molecular weight no greater than 1,500 and (B) solvent;
    ii) evaporating the solvent (B), and
    iii) converting at least a portion of the hydrogen silsesquioxane resing (A) to silica by exposing the surface of the said substrate to high-energy radiation.
2. The method as claimed in claim 1 wherein the substrate is an electronic device.
3. The method as claimed in claim 1 wherein the high-energy radiation is an electron beam.
4. The method as claimed in claim 1 wherein the surface is coated by spin coating.
5. The method as claimed in claim 1 wherein the hydrogen silsesquioxane resin is converted in an oxygen-containing gas.
6. The method as claimed in claim 5 wherein the hydrogen silsesquioxane resin is converted in air.
7. The method as claimed in claim 1 wherein at least a portion of the hydrogen silsesquioxane resin (A) is converted to silica by exposing the surface of the said substrate to high-energy radiation at a temperature of from 10° C. to 50° C.
8. The method as claimed in claim 1 wherein the coating composition comprises 5 to 50 weight percent hydrogen silsesquioxane resin (A) based on (A) and (B).
9. A method for the formation of an electrically insulating layer, wherein the method comprises
    i) coating the surface of a semiconductor substrate having an interconnect structure thereon with a silica thin film forming composition comprising (A) hydrogen silsesquioxane resin that contains at least 45 weight % hydrogen silsesquioxane resin with a molecular weight no greater than 1,500 and (B) solvent;
    ii) evaporating the solvent (B), and
    iii) converting at least a portion of the hydrogen silsesquioxane resin (A) to silica by exposing the surface of the said substrate to high-energy radiation.
10. The method as claimed in claim 9 wherein the hydrogen silsesquioxane resin coated on the surface of the semiconductor substrate is heated to a temperature of no greater than 60° C. prior to converting iii).
11. The method as claimed in claim 9 wherein the high-energy radiation is electron beam.

* * * * *